United States Patent [19]

Morcom et al.

[11] Patent Number: 4,595,943
[45] Date of Patent: Jun. 17, 1986

[54] REDUCED BETA VERTICAL TRANSISTORS AND METHOD OF FABRICATION

[75] Inventors: William R. Morcom, Melbourne Beach; Jeffrey D. Peters, Palm Bay, both of Fla.

[73] Assignee: Harris Corporation, Melbourne, Fla.

[21] Appl. No.: 870,548

[22] Filed: Jan. 18, 1978

[51] Int. Cl.[4] .......................................... H01L 27/04
[52] U.S. Cl. ..................................... 357/48; 357/44; 357/89; 148/175; 148/186
[58] Field of Search ................. 357/44, 48, 86, 89; 148/175, 186

[56] References Cited

U.S. PATENT DOCUMENTS

| 3,383,607 | 5/1968 | Avins | 357/48 |
| 3,878,551 | 4/1975 | Callahan, Jr. | 357/86 |
| 3,946,425 | 3/1976 | Shoji et al. | 357/48 |

OTHER PUBLICATIONS

Lin, Integrated Electronics, (Holden-Day, San Francisco, 1967), pp. 270-271.
Lehning, IEEE J. of Solid State Circuits, vol. SC9, Oct. 1974, p. 228.
Berger et al., IBM Tech. Discl. Bull., vol. 15, No. 5, Oct. 1972, p. 1625.

Primary Examiner—William D. Larkins
Attorney, Agent, or Firm—Barnes & Thornburg

[57] ABSTRACT

The current gain, beta, of a vertical transistor having an emitter formed in an epitaxial base on a substrate collector is reduced by forming a high impurity region of the conductivity type of the base at the base-collector boundary to increase the base width greater than the vertical distance between the emitter and collector. A plurality of vertical transistors having identical emitters and a common collector may be simultaneously fabricated with different current gains by individually selecting the horizontal dimensions of the buried high impurity regions.

18 Claims, 5 Drawing Figures

4,595,943

REDUCED BETA VERTICAL TRANSISTORS AND METHOD OF FABRICATION

BACKGROUND OF THE INVENTION

1. Field of the Invention

The present invention relates generally to vertical transistors and more specifically to a method of reducing the current gain or Beta of vertical transistors.

2. Description of the Prior Art

Because of the relatively simple implementation, the vertical transistor is a common device structure where the substrate plays an active part in the isolation structure, for instance, junction isolation. The transistor current gain is dependent upon resistivity of the epitaxial base layer and its thickness. The thickness is tightly controlled sinced the base width can be as great as 10 times greater than in the typical double diffused transistor. These vertical transistors are effective devices because the epitaxial base region achieves good lifetimes for carriers and a large collector-base junction enable carriers injected into the base to be collected by the substrate collector.

One method for reducing the beta transistor is illustrated in U.S. Pat. No. 3,770,519 wherein an emitter region is diffused into a high concentration impurity region of opposite conductivity type. This approach reduces the efficiency of the emitter.

There exists a need for a method of fabricating simultaneously a plurality of vertical transistors having individually selected current gains.

SUMMARY OF THE INVENTION

The present invention is a structure and method of fabrication of a plurality of vertical transistors having identical emitters formed in an identical epitaxial base layer on top of a common substrate collector and having individually selected current gains. A buried high impurity concentration region is formed at the boundary of the base and collector layers spaced below the emitter region to increase the base width and consequently reduce the current gain. The reduced current gain vertical transistors have a base width greater than the vertical distance between the emitter region and the collector substrate. The high impurity region is vertically aligned below the emitter and has horizontal dimensions which are at least coextensive with the area of the vertical projection of the emitter region on to the collector layer. Similarly the high concentration region may be sufficiently large to produce a substantially zero current gain.

The process of fabrication begins with the simultaneous diffusion of a plurality of selected horizontal dimension, high impurity concentration regions of a first conductivity type into a substrate of a second conductivity type. An epitaxial base layer of the first conductivity type is grown on the substrate and then divided into a plurality of junction isolated base regions by diffusing impurities of the second conductivity type through the base layer to the collector substrate. Identical emitter regions are then formed in the individual base regions by diffusing impurities of the second conductivity type into the base layer. The emitter regions, whose number is greater than the number of buried high impurity regions, are formed vertical above the buried high impurity regions. This method of fabrication provides vertical transistors having identical emitter and base regions and a common collector region with individually designed current gains.

OBJECTS OF THE INVENTION

An object of the present invention is to provide a method of simultaneously forming a plurality of vertical transistors having individually selected current gains.

Another object of the invention is to provide a vertical transistor having an epitaxial base region with a reduced current gain.

A further object of the invention is to provide a method of reducing the current gain of an epitaxial base, vertical transistor without substantially increasing the complexity of the fabrication process.

Other objects, advantages, and novel features of the invention will become apparent from the following detailed description of the invention when considered in conjunction with the accompanying drawings.

DESCRIPTION OF THE PREFERRED EMBODIMENTS

Figure 1:
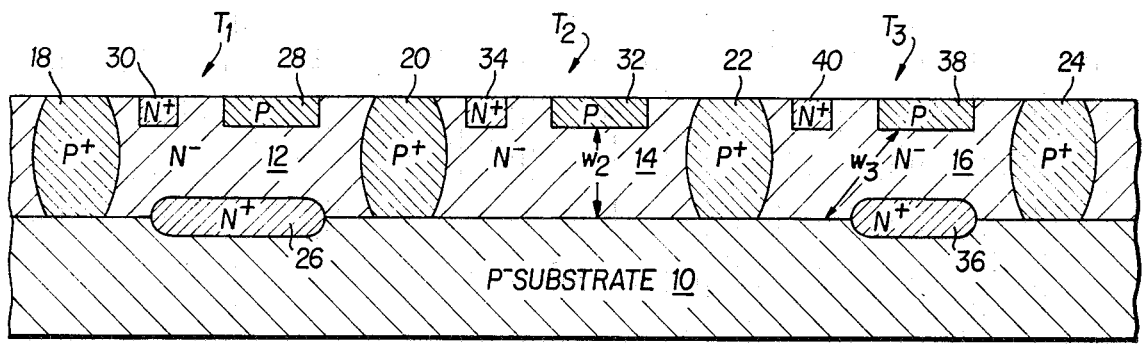
FIG. 1 is a cross-section of an intergrated circuit incorporating the principles of the present invention showing vertical transistors of three different current gains.

The principles of the present invention are illustrated in the integrated circuit of FIG. 1 wherein transistors $T_1$, $T_2$ and $T_3$ have different current gains and base widths. The semiconductor structure includes a substrate 10, and an epitaxial layer divided into regions 12, 14 and 16 by lateral junction isolation barriers 18, 20, 22 and 24. Transistor $T_1$ includes a buried high impurity region 26, an emitter region 28, and a base contact region 30. Transistor $T_2$ includes an emitter region 32 and a base contact region 34. Transistor $T_3$ includes a buried high impurity region 36, an emitter region 38, and a base contact region 40. The structure illustrated in FIG. 1 for transistors $T_1$, $T_2$ and $T_3$ are vertical PNP transistors having a substrate 10 serving as a common collector, an epitaxial layer divided into individual base regions 12, 14 and 16 and surface emitter regions 28, 32 and 38. As illustrated, the substrate is $P^-$ type, the lateral barrier regions 18, 20, 22, and 24 are $P^+$ type, the epitaxial base regions 12, 14, 16 are $N^-$ type, the buried regions 26 and 36 are $N^+$ type, the surface emitter regions 28, 32 and 38 are P type and the base contact regions 30, 34 and 40 are $N^+$ type.

Recognizing that the current gain of a transistor structure is dependent upon the resistivity of the epitaxial layer and the thickness of the layer or base width, the present invention allows for the simultaneous production of vertical transistors having identical collector, base and emitter structure but individually selected and designed current gain or Beta. This objective is achieved by utilizing a selectively designed buried high impurity region of the same conductivity type as the epitaxial base region at the boundary of the base layer and collector substrate. This region is vertically aligned with the emitter region so as to controllably increase the base width. Since the current gain or Beta of a vertical transistor is proportional to the inverse of the square of the base width, reduction of beta is achieved by increasing the base width.

Transistor $T_2$ has a base width $W_2$ which is equal to the vertical distance separating emitter region 32 and the collector substrate 10. The transistor $T_2$ has the maximum current gain since it has the minimum base width. Transistor $T_3$ has a base width $W_3$ measured from the emitter region 38 to the collector substrate 10 at an angle relative to the vertical. This width $W_3$ is a result of the positioning of the buried $N^+$ region 36 directly below the emitter region 38 and the buried $N^+$ region 36 being at least coextensive with the vertical projection of the emitter region 38 on to the collector substrate region 10. The buried layer 36 reduces the lifetime of the carriers since it has a heavier impurity concentration than the epitaxial base layer 16 and it reduces the area of effective collection. Transistor $T_1$ includes a buried high impurity $N^+$ region 26 extending horizontally almost completely across the boundary between the base region 12 and the collector 10 such that the current gain or Beta of transistor $T_1$ is essentially zero.

Thus transistors having a common collector, commonly formed epitaxial base regions, and identical surface emitter regions may be designed to have individually selected current gains by the formation of a buried high impurity region at the base-collector boundary. The current gain is in the range from a maximum of that of transistor $T_2$ wherein the base width is equal to the vertical distance between the surface emitter region and the collector region to substantially the zero gain of $T_1$. The placement and horizontal dimension of the buried high impurity region 36 provide the appropriate base width and corresponding current gain. The buried region must be vertically aligned with the surface emitter region and must be continuous and extend horizontally greater than the vertical projection of the emitter region onto the collector layer.

Figure 2:
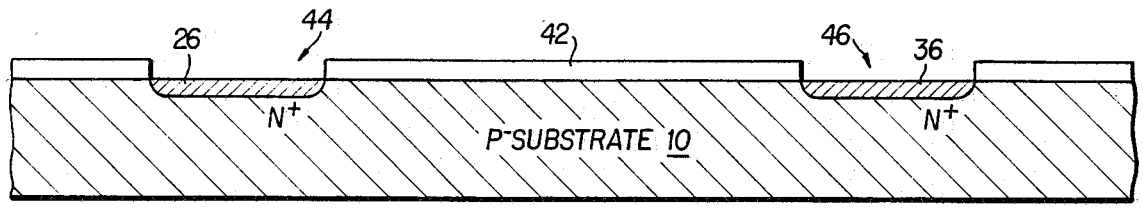
FIG. 2, 3, and 4 are cross-sections illustrating the method of fabricating the integrated circuit illustrated in FIG. 1.
Figure 3:
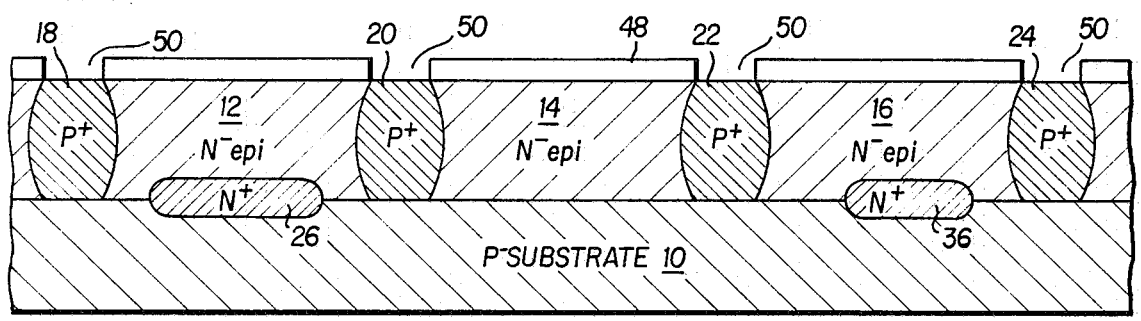
Figure 4:
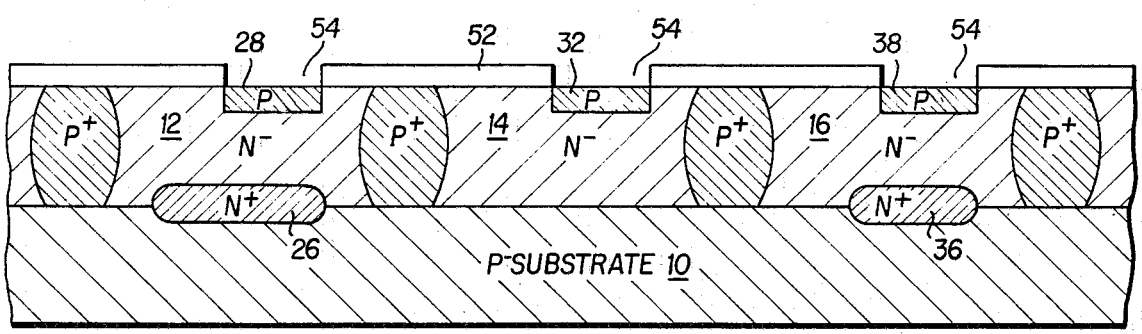

The process for fabricating the integrated circuit of FIG. 1 is illustrated in FIGS. 2, 3 and 4 beginning with a $P^-$ type substrate having a resistance of, for example, 10 ohm-centimeters. A masking layer 42 is formed on the top surface of the substrate 10 and openings 44 and 46 are provided therein defining the horizontal dimension of the buried regions 26 and 36. The masking material 42 may be an oxide layer with a photo resist thereon processed to form the openings 44 and 46. Although two openings are shown to form specific buried regions 26, 36, it is obvious that any number of openings may be provided and the horizontal dimension of the openings are chosen to produce a desired base width and corresponding current gain. A high concentration of N type impurities are introduced through the openings 44 and 46 to form the buried regions 26 and 36. The impurities may be introduced by deposit or ion implantation with a subsequent diffusion to the required depth. Impurities, for example, arsenic may be used to form regions 26, 36 having an impurity concentration of $5 \times 10^{19}$ carriers per cubic centimeter. The resulting structure is illustrated in FIG. 2.

The masking layer 42 is removed and an $N^{31}$ type epitaxial layer is grown having an impurity concentration of $1 \times 10^{16}$ carriers per cubic centimeter. The surface of the epitaxial layer is covered with a masking material 48 and delineated to provide openings 50 through which the lateral junction isolation barriers are formed. P impurities, for example, boron, are deposited and diffused through the $N^-$ epitaxial layer to the substrate collector region 10. The resulting junction isolation barrier regions 18, 20, 22 and 24 have an impurity concentration of $1 \times 10^{20}$ carriers per cubic centimeter, for example. These lateral isolation barriers divide the epitaxial layer into base regions 12, 14 and 16, as illustrated in FIG. 3.

Additional masking material may be provided over masking layer 48 or masking layer 48 may be removed and a new masking layer 52 provided. Identical openings for the formation of the surface emitter regions 28, 32 and 38 are formed in masking layer 52. P impurities are then introduced through the openings 54 and diffused to provide the emitter regions 28, 32, 38. Using boron, for example, the resulting emitter region (illustrated in FIG. 3) would have a impurity concentration of $7 \times 10^{18}$ carriers per cubic centimeter. The openings 54 are covered and new openings are provided to form the base contract regions 30, 34 and 40. Impurities, for example, phosphorus may be introduced by diffusion to provide base contact regions having an impurity region of $1 \times 10^{20}$ carriers per cubic centimeter. This results in the final structure illustrated in FIG. 1.

The buried high impurity concentration regions 26 and 36 diffuse from the substrate 10 into the epitaxial layer during the diffusion process of the after formed regions. It should be noted that the barrier regions 18, 20, 22 and 24 may be formed after the formation of the emitter regions and base contact regions, but it is preferred that they be formed before them such that the diffusion of the barrier regions do not affect the final impurity concentrations and distribution of the emitter and base contact regions. Similarly the base contact regions 30, 34 and 40 may be formed before the formation of the emitter regions 28, 32 and 38. The impurity concentration of the resulting structures described are mere examples of impurities used and other impurities and concentrations may be used depending upon the specific requirement of the characteristics of the final resulting transistor structure. The essence of the present invention being the formation of a vertical transistor having a common collector, an epitaxial base region and identical emitter regions while having individually selected base width and corresponding current gain.

Figure 5:
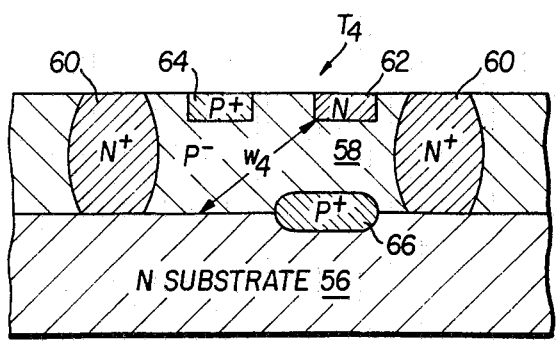
FIG. 5 is a cross-section of an integrated circuit of a NPN vertical transistor incorporating the principles of the present invention.

Although FIGS. 1 through 4 illustrate the use of PNP vertical transistors, the principles of the present invention are equally applicable to NPN transistors. FIG. 5 illustrates transistor $T_4$ having an N collector substrate 56, an epitaxial $P^-$ base layer 58 separated from the remainder of the epitaxial $P^{31}$ layer by $N^+$ lateral barriers regions 60, a N surface emitter region 62 and a $P^+$ base contact region 64. A buried high impurity $P^+$ region 66 is formed vertically below the emitter region 62 at the boundary of the epitaxial $P^-$layer 58 and the N collector-substrate layer 56. As with transistor $T_3$ the base width $W_4$ of transistor $T_4$ is greater than the vertical distance between the emitter region 62 and the collector layer 56.

From the preceding description of the preferred embodiments, it is evident that the objects of the invention are obtained and although the invention has been described and illustrated in detail, it is to be clearly understood that the same is by way of illustration and example only and is not to be taken by way of limitation. The spirit and scope of this invention is to be limited only by the terms of the appended claims.

What is claimed is:

1. In a vertical transistor having a collector region, a base region and an emitter region aligned vertically, the improvement comprising a buried, continuous, high impurity concentration region of the conductivity type of said base region, at the boundary of said base and collector regions and vertically spaced from said emitter region, said buried region being at least coextensive with the area of the vertical projection of said emitter region on said collector region to increase said base width greater than the vertical distance between said emitter and collector regions without reducing the operating range current gain to substantially zero.

2. The vertical transistor according to claim 1 wherein said collector region is a substrate and said base region is an epitaxial layer with lateral junction isolation.

3. The vertical transistor according to claim 1 wherein said high impurity region extends into said collector region.

4. The vertical transistor according to claim 4 wherein said emitter region is the only device region formed in said epitaxial layer between said lateral junction isolation.

5. The vertical transistor according to claim 1, wherein the junction of the emitter and base region is at a uniform depth from the surface of the wafer.

6. A method of decreasing the current gain of a vertical transistor having emitter, base and collector regions comprising forming a high impurity concentration region of the conductivity type of said base region spaced vertically from said emitter region at the boundary of said base and collector region and at least coextensive with the area of the vertical projection of said emitter region to increase said base width greater than the vertical distance between said emitter and collector regions without reducing the operating range current gain to substantially zero.

7. The method according to claim 6 including selecting said horizontal dimensions to produce a base width needed for a desired current gain reduction.

8. A method of selectively altering current gain of a plurality of vertical transistors having their respective collector, base and emitter regions formed substantially identical comprising forming an individually selected buried high impurity concentration region of the conductivity type of said base region spaced from said emitter region at the boundary of said base and collector regions and of sufficient horizontal dimensions to define a base width whose square is inversely proportional to a desired current gain greater than substantially zero for each transistor.

9. The method according to the claim 8 wherein the current gain is reduced by forming said high impurity region at least coextensive with the area of the vertical projection of said emitter region on said collector region to increase said base width greater than the vertical distance between said emitter and collector regions.

10. A process for fabricating a vertical transistor comprising:
    diffusing impurities of a first conductivity type into a substrate collector layer of a second conductivity type opposite said first conductivity type to form a high impurity region;
    epitaxially depositing a base layer of said first conductivity on said collector layer; and
    diffusing impurities of said second conductivity type into the top surface of said base layer to form an emitter region directly above and spaced from said high impurity region having horizontal dimensions smaller than said high impurity region to increase the base width greater than the vertical distance between said emitter region and said collector layer without reducing the operating range current gain to substantially zero.

11. The process according to claim 10 wherein said high impurity region is formed at least coextensive with the vertical projection of the to be formed emitter region on said collector layer.

12. A process for fabricating a plurality of vertical transistors simultaneously with different current gains comprising:
    diffusing impurities of a first conductivity type into a substrate collector layer of a second conductivity type opposite said first conductivity type to form a plurality of spaced high impurity regions, each of said high impurity regions having individually selected horizontal dimensions to define individual operating current gains greater than substantially zero;
    epitaxially depositing a base layer of said first conductivity type on said collector layer; and
    diffusing a plurality of substantially identical emitter regions of said second conductivity type into said base region spaced and aligned above a respective high impurity region.

13. The process according to claim 12 wherein said high impurity region is formed at least coextensive with the vertical projection of the to be formed emitter region on said collector layer.

14. The process according to claim 12 wherein a greater number of emitter regions are formed than high impurity regions.

15. The process according to claim 12 wherein said high impurity regions are formed to have selective horizontal dimension sufficient to increase the individual base width greater than the vertical distance between said emitter region and said collector layer.

16. The process according to claim 12 including diffusing into said base layer to said collector layer impurities of said second conductivity type to divide said base layer into a plurality of junction isolated base regions.

17. An integrated circuit having a plurality of vertical transistors of different current gains comprising:
    a substrate forming a common collector for each vertical transistor;
    an epitaxial layer on said substrate forming the base of each of said vertical transistors;
    lateral isolation regions extending from the surface of said epitaxial layer to said substrate for dividing said epitaxial layer into a plurality of laterally isolated base regions;
    a plurality of emitter regions, one formed in the surface of each base region; and
    a plurality of buried, high-impurity concentration regions of the conductivity type of the base region, one at the boundary of each base and the common collector region vertically spaced from the emitter region, said buried regions having individually selected horizontal dimensions to define individual operating current gains greater than substantially zero.

18. The integrated circuit according to claim 17 wherein said emitter regions are the only device regions formed in said epitaxial layer between said lateral junction isolation for each vertical transistor.

* * * * *